(12) United States Patent
Jung et al.

(10) Patent No.: US 8,693,272 B2
(45) Date of Patent: Apr. 8, 2014

(54) SENSING CIRCUIT

(75) Inventors: Seong-Ook Jung, Seoul (KR); Jisu Kim, Seoul (KR); Kyungho Ryu, Seoul (KR); Seung H. Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 285 days.

(21) Appl. No.: 13/173,641

(22) Filed: Jun. 30, 2011

(65) Prior Publication Data

US 2013/0002352 A1    Jan. 3, 2013

(51) Int. Cl.
*G11C 7/00* (2006.01)

(52) U.S. Cl.
USPC ............... 365/206; 365/189.06; 365/189.15; 365/207; 365/208

(58) Field of Classification Search
USPC ........ 365/206, 207, 108, 189.15, 189.06, 208
See application file for complete search history.

(56) References Cited

U.S. PATENT DOCUMENTS

| 5,291,123 | A | 3/1994 | Brown |
| 5,751,642 | A | 5/1998 | Yoo |
| 6,038,173 | A | 3/2000 | Yero |
| 7,082,061 | B2 * | 7/2006 | Chou et al. ............... 365/189.06 |
| 7,920,435 | B2 * | 4/2011 | Ogawa .......................... 365/205 |
| 2005/0030814 | A1 | 2/2005 | Oh et al. |
| 2006/0120174 | A1 | 6/2006 | Chou et al. |
| 2010/0157654 | A1 | 6/2010 | Jung et al. |

OTHER PUBLICATIONS

International Search Report and Written Opinion—PCT/US2012/045172—ISA/EPO—Oct. 8, 2012.

* cited by examiner

*Primary Examiner* — Son Dinh
(74) *Attorney, Agent, or Firm* — Sam Talpalatsky; Nicholas J. Pauley; Joseph Agusta

(57) ABSTRACT

A circuit includes a degeneration p-channel metal-oxide-semiconductor (PMOS) transistor, a load PMOS transistor, and a clamp transistor configured to clamp a voltage applied to a resistance based memory element during a sensing operation. A gate of the load PMOS transistor is controlled by an output of an operational amplifier.

25 Claims, 6 Drawing Sheets

SENSING CIRCUIT

I. FIELD

The present disclosure is generally related to a sensing circuit.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and Internet Protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player.

Advances in non-volatile memory technology include resistance-based memory, such as magnetic random access memory (MRAM). MRAM technology can use memory cells that include magnetic tunnel junctions (MTJs) and access transistors. A sense amplifier may be coupled to one or more cells in an array of the memory cells. The sense amplifier may "read" data stored at a resistance-based memory element by passing a current through the resistance-based memory element to determine if the memory element has a high resistance or a low resistance. In determining the resistance, the sense amplifier may compare a voltage due to the current through the resistance-based memory element to a reference voltage to obtain a difference and the sense amplifier may amplify the compared difference. As memory devices become smaller, the effects of process variations increase, thereby increasing the difficulty of accurately reading the data.

III. SUMMARY

A sensing circuit uses an operational amplifier to control a gate voltage applied to a load p-channel metal-oxide semiconductor field-effect transistor (PMOS). Because the operational amplifier controls the gate voltage of the load PMOS transistor, the load PMOS transistor has large output resistance, thus improving a voltage difference between data values and reducing output voltage variations.

A sensing circuit includes an operational amplifier circuit to control a gate voltage applied to a load p-channel metal-oxide semiconductor field-effect transistor (PMOS). A first input of the operational amplifier is responsive to a control voltage. A second input of the operational amplifier is coupled to a source terminal of the load PMOS and coupled to a drain terminal of a degeneration PMOS. By utilizing the degeneration PMOS and by controlling the gate voltage of the load PMOS with the operational amplifier circuit, output resistance of the sensing circuit and the sensing margin of the sensing circuit may be increased.

In a particular embodiment, a circuit includes a degeneration PMOS transistor, a load PMOS transistor, and a clamp transistor. The clamp transistor is configured to clamp a voltage applied to a resistance based memory element during a sensing operation. A gate of the load PMOS transistor is controlled by an output of an operational amplifier that has a first input responsive to a control voltage and a second input coupled to a source terminal of the load PMOS transistor and coupled to a drain terminal of the degeneration PMOS transistor.

In another particular embodiment, a method includes controlling a gate voltage applied to a load PMOS transistor by an output of an operational amplifier. The operational amplifier has a first input responsive to a control voltage and a second input coupled to the load PMOS transistor and to a degeneration PMOS transistor.

Particular advantages provided by at least one of the disclosed embodiments of a sensing circuit include achieving one or more of increased output resistance, enhanced sensing margin, and increased process variation tolerance as compared to a sensing circuit that does not utilize a degeneration PMOS and that does not control a gate voltage of a load PMOS by an operational amplifier circuit during a sensing operation.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
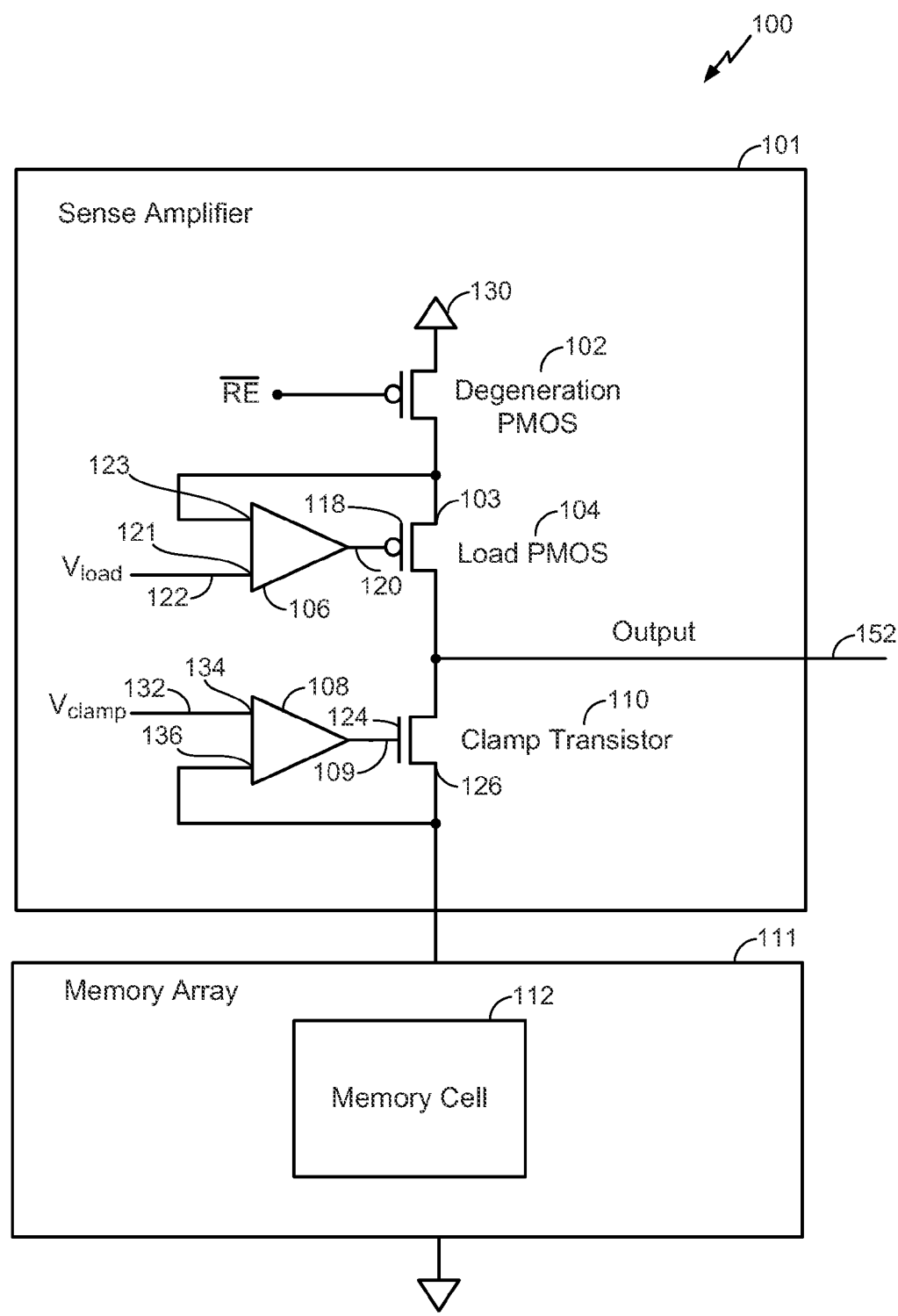
FIG. 1 is a diagram of a first illustrative embodiment of a sensing circuit.

Referring to FIG. 1, a diagram of a first illustrative embodiment of a sensing circuit is disclosed and generally designated 100. The sensing circuit 100 includes a sense amplifier 101 coupled to a memory array 111. The memory array 111 includes a plurality of memory cells such as an illustrated memory cell 112. The memory array 111 typically includes a plurality of the memory cells 112. The memory array 111 may be a magnetoresistive random access memory (MRAM), a phase-change random access memory (PRAM), or a spin torque transfer MRAM (STT-MRAM) as illustrative examples.

The sense amplifier 101 includes a degeneration PMOS transistor 102, a load PMOS transistor 104, and a clamp transistor 110. The sense amplifier 101 further includes a power supply 130, an output voltage 152, a first operational amplifier circuit 106, and a second operational amplifier circuit 108.

The clamp transistor 110 is configured to clamp a voltage applied to a resistance based memory element during a sensing operation. In a particular embodiment, the sensing operation may occur during a memory read. A resistance based memory element is a device having a first resistance corresponding to a logic "one" value and a second resistance corresponding to a logic "zero" value. An example of a resistance based memory element is a magnetic tunnel junction NTT) device and the MTI may be incorporated within the memory cell 112. The clamp transistor 110 is configured to clamp a voltage applied to the memory cell 112 within the memory array 111. In a particular embodiment, the clamp transistor 110 is an n-channel metal-oxide-semiconductor (NMOS) transistor.

A gate 118 of the load PMOS transistor 104 is controlled by an output 120 of the first operational amplifier circuit 106. The first operational amplifier circuit 106 includes a first input 121 responsive to a control signal 122 (labeled \load), and a second input 123 coupled to a terminal of the load PMOS transistor 104. In a particular embodiment, the second input 123 of the first operational amplifier circuit 106 is responsive to a source terminal 103 of the load PMOS transistor 104. In this arrangement, a feedback loop from the load PMOS transistor 104 via the source terminal 103 is provided to the second input 123 of the first operational amplifier circuit 106. The source terminal 103 is coupled to a drain terminal of the degeneration PMOS transistor 102.

The load PMOS transistor 104 provides a means for providing a load in response to a gate voltage, where the gate voltage is controlled via the output 120 of the first operational amplifier circuit 106 that includes the first input 121 and the second input 123.

A gate 124 of the clamp transistor 110 is controlled by an output 109 of the second operational amplifier circuit 108. The second operational amplifier circuit 108 has a first input 134 responsive to a second control signal 132 (labeled Vclamp), and a second input 136 coupled to a terminal of the clamp transistor 110. In a particular embodiment, the second input 136 of the second operational amplifier circuit 108 is responsive to a drain terminal 126 of the clamp transistor 110. In this arrangement, a feedback loop from the clamp transistor 110 via the drain terminal 126 is provided to the second input 136 of the second operational amplifier circuit 108.

The sensing circuit 100 may be included within an apparatus that includes the clamp transistor 110 which provides a means for clamping a voltage applied to a resistance based memory element during a sensing operation. In a particular embodiment, the resistance based memory element is an MTJ element or a memory cell that contains an MTJ element. In a particular illustrative embodiment, the means for clamping is coupled to the means for providing the load. For example, the clamp transistor 110 is coupled to the load PMOS transistor 104 as shown in FIG. 1.

The sensing circuit 100 may be integrated within a semiconductor die. The semiconductor die may be included within an integrated circuit or similar type of semiconductor device. Such a semiconductor device may be incorporated within many electronic devices. For example, an electronic device that may include a semiconductor die may be selected from the group consisting of a set top box, a music player, a video player, an entertainment unit, a navigation device, a communications device, a personal digital assistant (PDA), fixed location data unit, and a computer, into which any of the circuit elements shown in FIG. 1 may be integrated. For example, the load PMOS transistor 104 and the clamp transistor 110 may be transistors within an integrated circuit that is incorporated within an electronic device.

In a particular embodiment, the sensing circuit 100 may operate in one of two primary states: a logic 1 state indicating a logic 1 data value is stored at the memory cell 112 and a logic 0 state indicating a logic 0 data value is stored at the memory cell 112. The sensing circuit 100 senses a voltage difference between the data value stored at the memory cell 112 and a reference voltage (not shown) based on a resistance of the memory cell 112. In a particular embodiment, the reference voltage is a voltage derived from another sensing circuit having a similar structure to the sensing circuit 100. The voltage difference (e.g., the difference between the output voltage 152 and the reference voltage) is provided to a sense amplifier (not shown). By increasing the voltage difference (e.g., increasing sensing margin), the data value (e.g., 0 or 1) stored at the memory cell 112 may be more accurately read.

The circuit arrangement shown in FIG. 1 may beneficially compensate for voltage variation due to aspects such as process variation and other environmental factors. By using the operational amplifier 106, a degeneration PMOS transistor 102, and a feedback path to control the gate voltage of the load PMOS transistor 104, the output resistance of the load PMOS transistor 104 becomes large. Because the load PMOS transistor 104 has large output resistance, a voltage difference can be increased and the output voltage variation can be reduced despite current variation caused by process variation and other environmental factors. Because the voltage difference can be increased, an enhanced sensing margin may be achieved. Accordingly, the sensing circuit 100 improves sensing margin by utilizing a degeneration PMOS 102 and by controlling the gate voltage of a load PMOS 104 by a feedback arrangement and an operational amplifier circuit 106.

Figure 2:
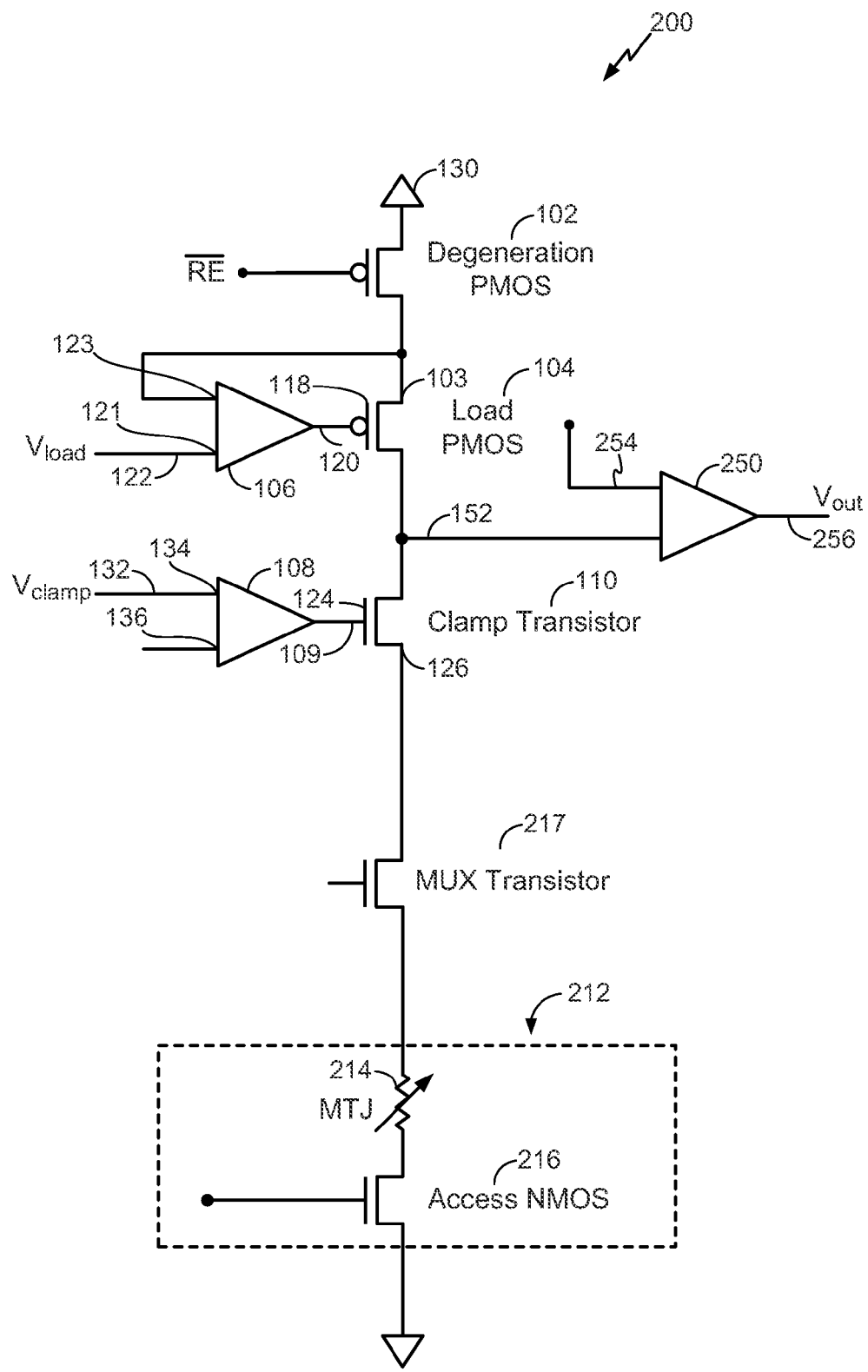
FIG. 2 is a circuit diagram of a second illustrative embodiment of a sensing circuit.

Referring to FIG. 2, a diagram of a second illustrative embodiment of a sensing circuit is disclosed and generally designated 200. The sensing circuit 200 includes many features of the sensing circuit 100 of FIG. 1. In addition, the sensing circuit 200 includes an output stage responsive to the data voltage 152. The output stage includes a sense amplifier 250 including as a first input the data voltage 152 and including as a second input a reference voltage 254. In a particular embodiment, the reference voltage 254 is a voltage derived from another sensing circuit having a similar structure to the sensing circuit 200. The output of the sense amplifier 250 includes an output voltage (Vout) 256 which provides an indication of a sensed output of the sensing circuit 200 as described in further detail below.

The sensing circuit 200 further includes a multiplexor (MUX) transistor 217 and a resistance based memory element 212. The resistance based memory element 212 includes a magnetic tunnel junction (MTJ) 214 and an NMOS transistor 216. The other circuit elements of the sensing circuit 200 are similar in structure and operate similarly to the corresponding elements of the sensing circuit 100 of FIG. 1.

For example, the sensing circuit 200 includes the degeneration PMOS transistor 102, the load PMOS transistor 104, and the clamp transistor 110. The sense amplifier circuitry further includes the power supply 130, the data voltage 152, the first operational amplifier circuit 106, and the second operational amplifier circuit 108. The clamp transistor 110 is configured to clamp a voltage applied to the resistance based memory element 212 during a sensing operation. In a particular embodiment, the sensing operation is a memory read.

During operation, the sensing circuit 200 operates in one of two primary states: a logic 1 state indicating a logic 1 value is stored at the resistance based memory element 212 and a logic 0 state indicating a logic 0 value is stored at the resistance based memory element 212. For example, if the data voltage 152 is greater than the reference voltage 254, the sense amplifier 250 may provide a high value at its output 256 indicating the logic 1 state (or a logic high state). Alternatively, if the data voltage 252 is lower than the reference voltage 254, the sense amplifier 250 may provide a low value at its output 256 indicating the logic 0 state (or a logic low state). As such, the relative voltage between the data voltage 152 and the reference voltage 254 as detected by the sense amplifier 250 provides an indication of the sensed output of the sensing circuit 200. Thus, if a relative difference between the data voltage 152 and the reference voltage 254 is increased, a greater sense margin to detect a logic 0 or a logic 1 condition with respect to the sense amplifier 250 may be provided.

Performing statistical analysis of a population of memory devices may enable a designer to address process variations (especially in a sense amplifier) which tend to increase with technology scaling. A signal margin $\Delta V$, such as a sense amplifier margin, may correspond to a difference between a voltage V1 and a voltage Vref ($\Delta V1$) or a difference between a voltage Vref and a voltage V0 ($\Delta V0$). For example, voltage V1 may correspond to the data voltage 152 of FIG. 2 when a logic 1 value is stored at the resistance based memory element 212, and voltage Vref may correspond to the reference voltage 254 of FIG. 2. Alternatively, voltage V0 may correspond to the data voltage 152 of FIG. 2 when a logic 0 value is stored at the resistance based memory element 212, and voltage Vref may correspond to the reference voltage 254 of FIG. 2. Statistical analysis may report mean (i.e., average) and sigma (i.e., standard deviation) values of measured variables $\Delta V0$ and $\Delta V1$. A designer may take (mean–N*sigma) of $\Delta V0$ and $\Delta V1$ as a representative statistical value, where the value of N is chosen to achieve a desired yield. By improving signal margin $\Delta V$, memory device yield may be improved.

Figure 3A:
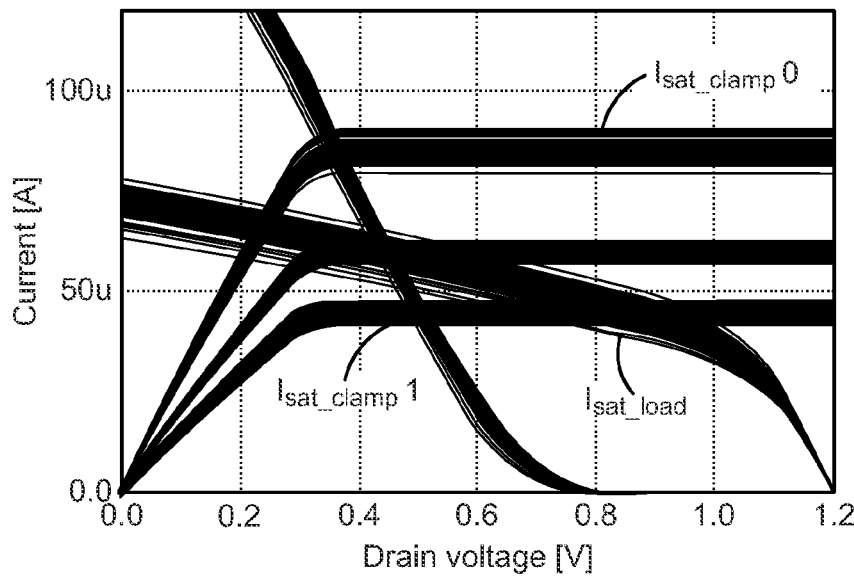
FIG. 3A is a graphical diagram illustrating load lines of a sensing circuit including a clamp NMOS transistor controlled by an operational amplifier and a load PMOS transistor controlled by a fixed gate voltage.
Figure 3B:
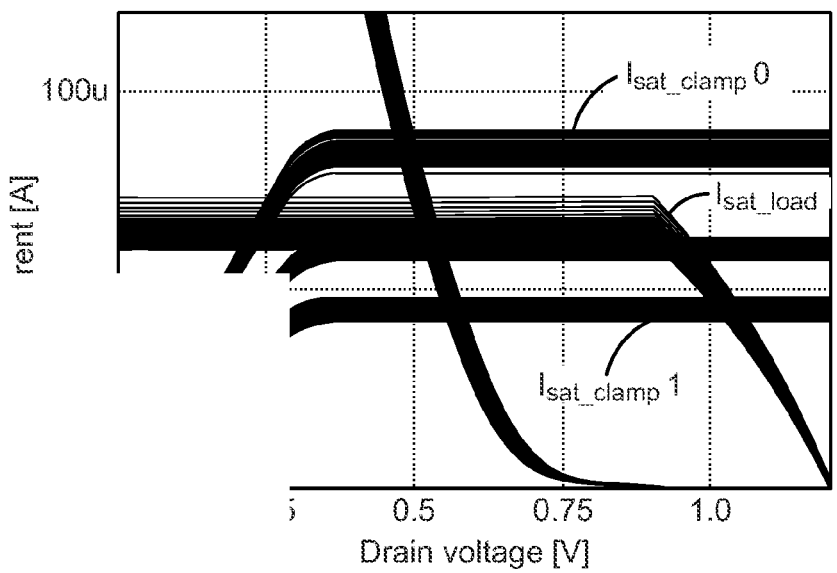
FIG. 3B is a graphical diagram illustrating load lines of a sensing circuit including a load PMOS transistor controlled by a first operational amplifier and a clamp NMOS transistor controlled by a second operational amplifier.

FIGS. 3A and 3B are graphical diagrams illustrating simulation results of load lines of sensing circuits. Referring to FIG. 3A, a diagram of load line characteristics of a sensing circuit including a clamp NMOS transistor controlled by an operational amplifier and a load PMOS transistor controlled by a fixed gate voltage is depicted and generally designated 302. A first curve Isat_clamp 0 illustrates a current-voltage (I-V) characteristic for a logic "zero" circuit at a resistance based memory element and a second curve Isat_clamp 1 illustrates a current-voltage (I-V) characteristic for a logic "one" circuit at the resistance based memory element. Load line Isat_load corresponds to I-V characteristics of the load PMOS transistor. In the illustrative embodiment shown in FIG. 3A, a width of the load PMOS transistor is 2.0 um; a width of the clamp NMOS transistor is 2.0 um; a voltage VDD_OPAMP at the clamp NMOS=1.2V; and a voltage Vsense at a power supply of the sensing circuit=1.2V. The simulated values of $\Delta V_0$ and $\Delta V1$ are as follows: (mean–3*sigma) of $\Delta V_0$=0.132 mV and (mean–3*sigma) of $\Delta V_1$=0.152 mV. The signal margin $\Delta V$ is 0.132 mV (i.e. the smaller of (mean–3*sigma) of $\Delta V_0$ and (mean–3*sigma) of $\Delta V_1$).

In contrast to FIG. 3A, FIG. 3B depicts load line characteristics of a sensing circuit (such as the sensing circuit 100 of FIG. 1 and the sensing circuit 200 of FIG. 2) including a load PMOS transistor controlled by a first operational amplifier and a clamp NMOS transistor controlled by a second operational amplifier, generally designated 301, A first curve Isat_clamp 0 illustrates a current-voltage (I-V) characteristic for the logic "zero" circuit at the resistance based memory element, and a second curve Isat_clamp 1 illustrates a current-voltage (I-V) characteristic for the logic "one" circuit at the resistance based memory element. Load line Isat_load corresponds to I-V characteristics of the load PMOS transistor. In the illustrative embodiment shown in FIG. 3B, a width of the load PMOS transistor is 2.0 um; a width of the clamp NMOS transistor is 2.0 um; the voltage VDD_OPAMP=1.2V; and the voltage Vsense=1.2V. For example, when a simulation voltage of 1.2 volts at the power supply 130 (e.g., Vsense), and at the first operational amplifier 106 (e.g., VDD_OPAMP is used, the simulated values of $\Delta V_0$ and $\Delta V_1$ are as follows: (mean–3*sigma) of $\Delta V_1$=0.306 mV and (mean–3*sigma) of $\Delta V_1$=0.367 mV. The signal margin $\Delta V$ is 0.306 mV (i.e., the smaller of (mean–3*sigma) of $\Delta V_0$ and (mean–3*sigma) of $\Delta V_1$). Comparing the signal margin $\Delta V$ associated with the circuit depicted in FIG. 3A (0.132 mV) with the signal margin $\Delta V$ associated with the circuit depicted in FIG. 3B (0.306 mV), the signal margin is improved using an operational amplifier to control the gate voltage of the load PMOS transistor. For example, the signal margin is improved by using the operational amplifier 106 to control the gate voltage of the load PMOS transistor 104.

Figure 4:
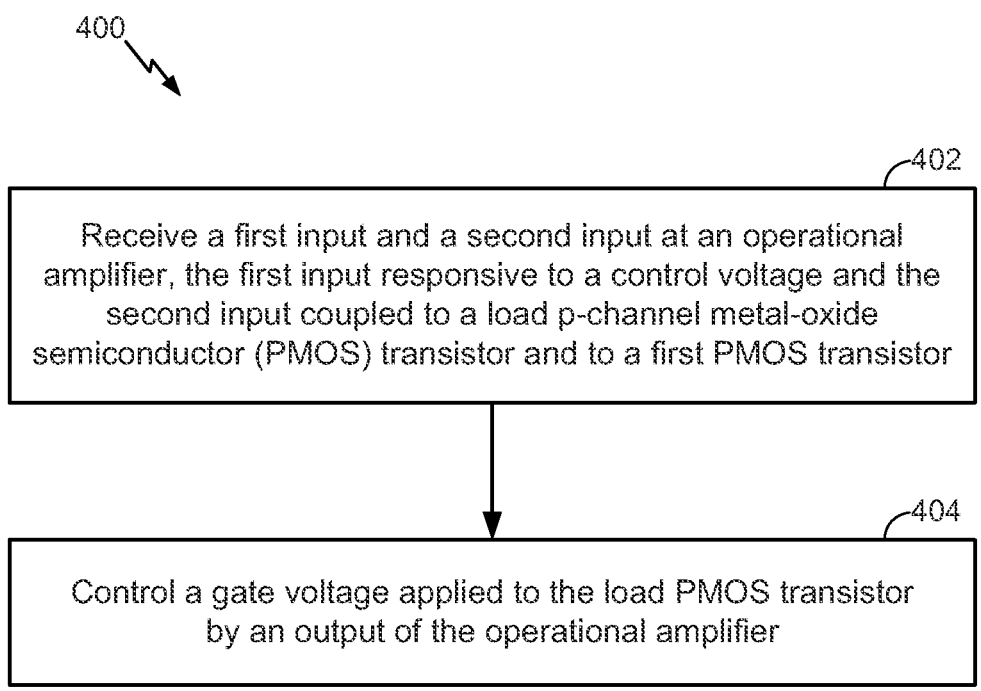
FIG. 4 is a flow diagram of an illustrative embodiment of a method of operation of a sensing circuit.

Referring to FIG. 4, a flow diagram of an illustrative embodiment of a method of operation of a sensing circuit is disclosed and generally designated 400. The method may be performed by a sensing circuit, such as the sensing circuit 100 of FIG. 1 or the sensing circuit 200 of FIG. 2.

The method 400 includes controlling a gate voltage applied to a load PMOS transistor by an output of an operational amplifier that has a first input responsive to a control signal and a second input coupled to the load PMOS transistor. For example, as shown at 402, the first input and the second input are received at the operational amplifier. The first input is responsive to a control voltage and the second input is coupled to the load PMOS and to the degeneration PMOS. As shown at 404, the gate voltage applied to the load PMOS is controlled by the output of the operational amplifier.

To illustrate, in FIG. 1, the source terminal 103 of the load PMOS transistor 104 is coupled to the drain terminal of the degeneration PMOS transistor 102. The gate voltage applied to the load PMOS transistor 104 is controlled by the output 120 of the first operational amplifier circuit 106. The first operational amplifier circuit 106 includes a first input 121 responsive to the control signal 12 (Vload) and a second input 123 coupled to the source terminal 103 of the load PMOS transistor 104. By utilizing a degeneration PMOS and by controlling a gate voltage of a load PMOS by use of a feedback path and an operational amplifier circuit, sensing margin of a sensing circuit may be increased.

Figure 5:
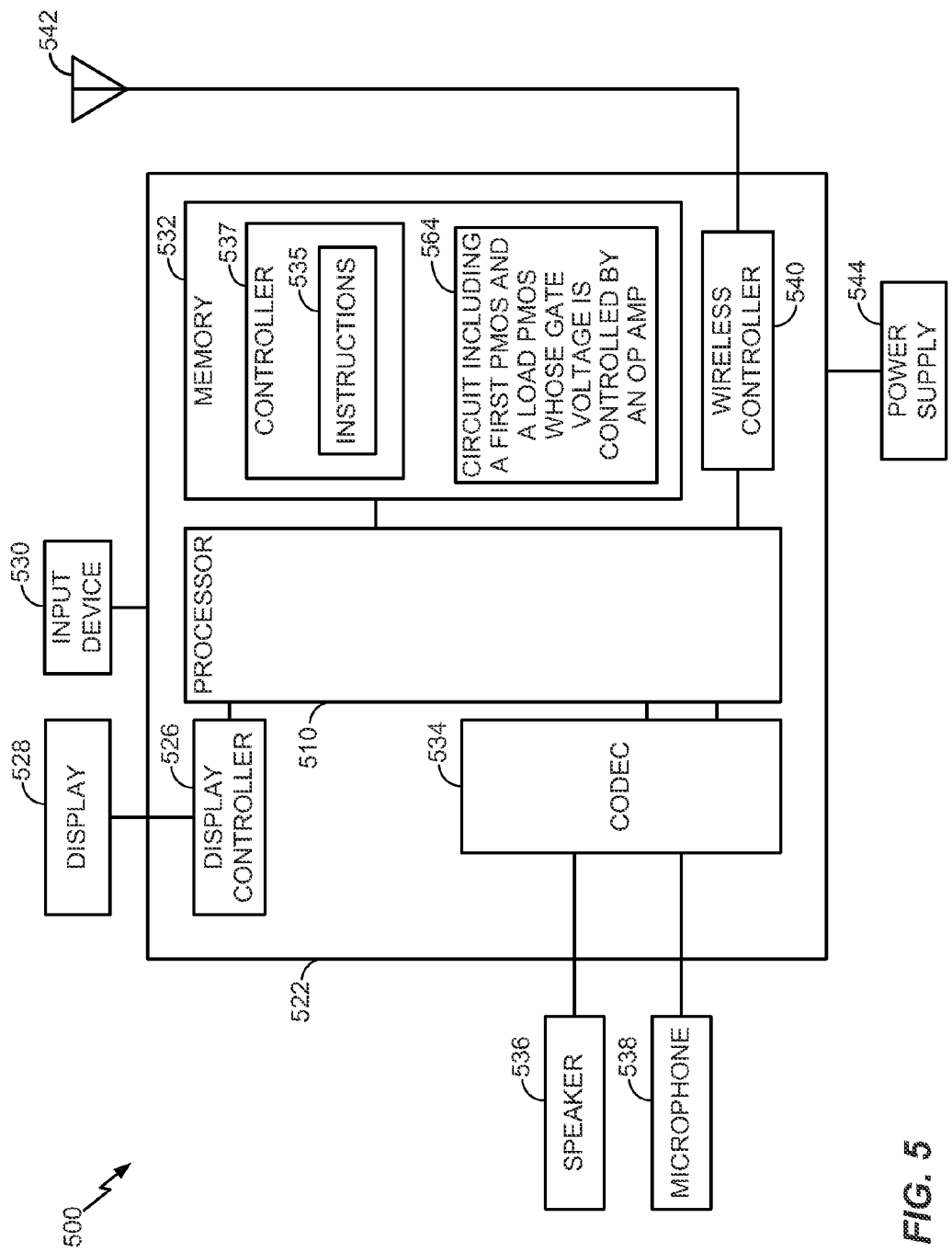
FIG. 5 is an illustrative embodiment of an electronic device that includes a load PMOS having a gate controlled by an output of an operational amplifier circuit.

Referring to FIG. 5, a block diagram of a particular illustrative embodiment of an electronic device including a circuit 564 including a degeneration PMOS and a load PMOS whose gate voltage is controlled by an output of an operational amplifier circuit is depicted and designated 500. The device 500 may be an electronic device such as a Personal Digital Assistant (PDA), a wireless mobile device, a computing device, another type of device, or any combination thereof. The device 500 includes a processor 510 such as a digital signal processor (DSP). The processor 510 is coupled to a memory 532 that may include the circuit 564 including a degeneration PMOS and a load PMOS whose gate voltage is controlled by an output of an operational amplifier circuit. For example, the circuit 564 may be the sensing circuit 100 of FIG. 1, the sensing circuit 200 of FIG. 2, or any combination thereof. The memory 532 includes a controller 537. The controller 537 includes processor instructions 535. The controller 537 may be a processor, a state machine, or another circuit configured to control operation of the circuit 564. The memory 532 may be a non-transient computer-readable medium storing the processor instructions 535 that are executable to cause the controller 537 to perform any of the methods described herein to control operation of the circuit 564. For example, the instructions 535 may include instructions to control a gate voltage applied to a load PMOS transistor by an output of an operational amplifier that has a first input responsive to a control voltage and a second input coupled to the load. PMOS transistor and to a degeneration PMOS transistor. In a particular embodiment, the controller 537 may be integrated into the electronic device 500.

A coder-decoder (CODEC) 534, a display controller 526, and a wireless controller 540 are coupled to the processor 510. The display controller 526 is coupled to a display 528. A speaker 536 and a microphone 504 can be coupled to the CODEC 534.

The wireless controller 540 can be coupled to a wireless antenna 542. In a particular embodiment, the processor 510, the display controller 526, the memory 532, the CODEC 534, and the wireless controller 540 are included in a system-in-package or system-on-chip device 522. In a particular embodiment, an input device 530 and a power supply 544 are coupled to the system-on-chip device 522. Moreover, in a particular embodiment, as illustrated in FIG. 5, the display 528, the input device 530, the speaker 536, the microphone 504, the wireless antenna 542, and the power supply 544 are external to the system-on-chip device 522. However, each of the display 528, the input device 530, the speaker 536, the microphone 504, the wireless antenna 542, and the power supply 544 can be coupled to a component of the system-on-chip device 522, such as an interface or a controller.

Figure 6:
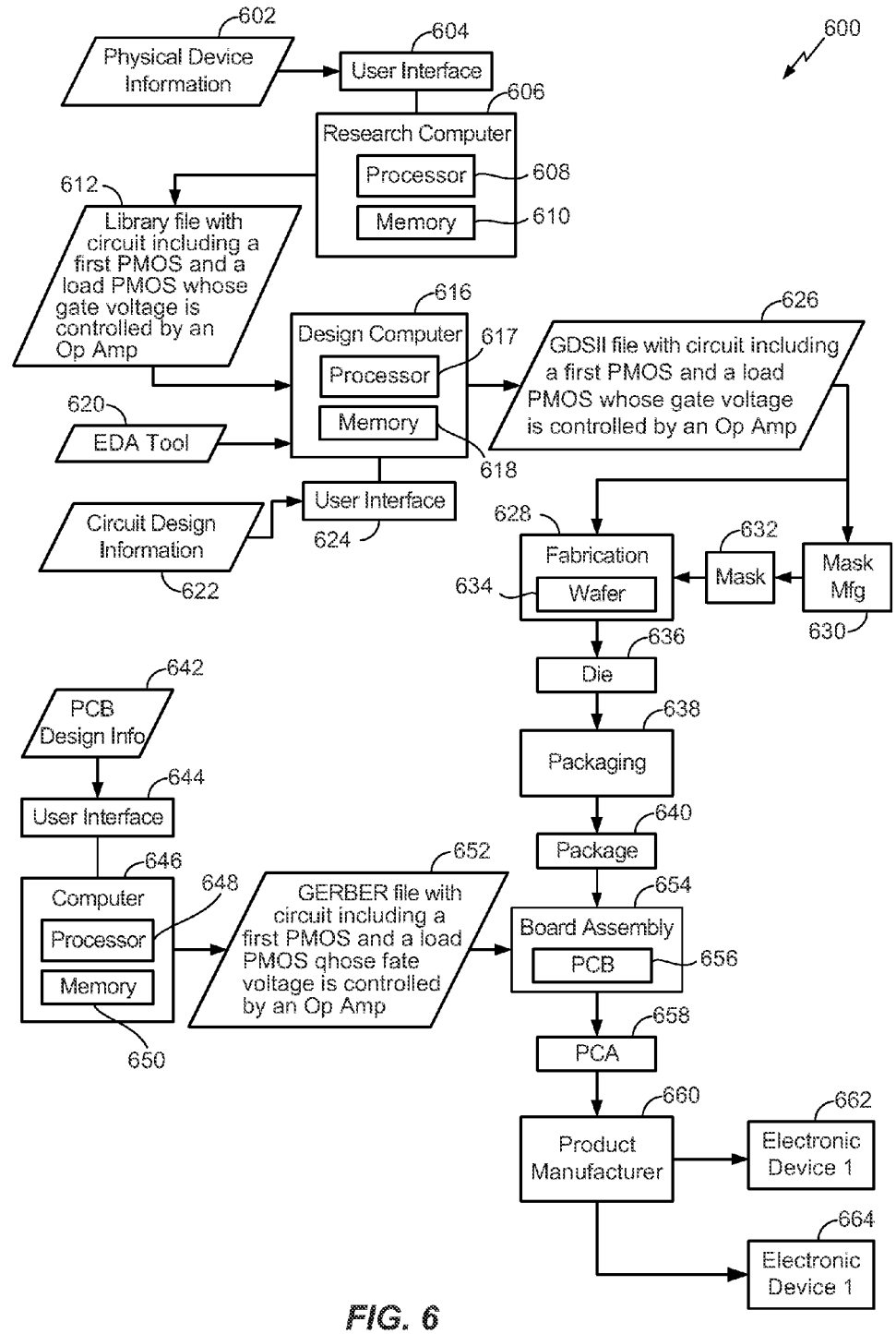
FIG. 6 is an illustrative embodiment of a method of manufacturing an integrated circuit device that includes a load PMOS transistor having a gate controlled by an output of an operational amplifier circuit.

FIG. 6 is a data flow diagram of a particular illustrative embodiment of a manufacturing process to manufacture electronic devices that include a sensing circuit (e.g., sensing circuit including a load PMOS having a gate controlled by an output of an operational amplifier circuit as illustrated in FIGS. 1-2).

The foregoing disclosed devices and functionalities may be designed and configured into computer files (e.g. RTL, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above. FIG. 6 depicts a particular illustrative embodiment of an electronic device manufacturing process 600.

Physical device information 602 is received in the manufacturing process 600, such as at a research computer 606. The physical device information 602 may include design information representing at least one physical property of a semiconductor device, such as the sensing circuit 100 of FIG. 1, the sensing circuit 200 of FIG. 2, or any combination thereof. For example, the physical device information 602 may include physical parameters, material characteristics, and structure information that is entered via a user interface 604 coupled to the research computer 606. The research computer 606 includes a processor 608, such as one or more processing cores, coupled to a computer readable medium such as a memory 610. The memory 610 may store computer readable instructions that are executable to cause the processor 608 to transform the physical device information 602 to comply with a file format and to generate a library file 612.

In a particular embodiment, the library file 612 includes at least one data file including the transformed design information. For example, the library file 612 may include a library of semiconductor devices including the sensing circuit 100 of FIG. 1, the sensing circuit 200 of FIG. 2, or any combination thereof, that is provided for use with an electronic design automation (EDA) tool 620.

The library file 612 may be used in conjunction with the EDA tool 620 at a design computer 614 including a processor 617, such as one or more processing cores, coupled to a memory 618. The EDA tool 620 may be stored as processor executable instructions at the memory 618 to enable a user of the design computer 614 to design a system using a sensing circuit of the library file 612. For example, a user of the design computer 614 may enter circuit design information 622 via a user interface 624 coupled to the design computer 614. The circuit design information 622 may include design information representing at least one physical property of a semiconductor device, such as the sensing circuit 100 of FIG. 1, the sensing circuit 200 of FIG. 2, or any combination thereof. To illustrate, the circuit design property may include identification of particular circuits and relationships to other elements in a circuit design, positioning information, feature size information, interconnection information, or other information representing a physical property of a semiconductor device.

The design computer 614 may be configured to transform the design information, including the circuit design information 622, to comply with a file format. To illustrate, the file format may include a database binary file format representing planar geometric shapes, text labels, and other information about a circuit layout in a hierarchical format, such as a Graphic Data System (GDRII) file format. The design computer 614 may be configured to generate a data file including the transformed design information, such as a GDSII file 627 that includes information describing the sensing circuit 100 of FIG. 1, the sensing circuit 200 of FIG. 2, or any combination thereof in addition to other circuits or information. To illustrate, the data file may include information corresponding to a system-on-chip (SOC) that includes the sensing circuit 100 of FIG. 1, the sensing circuit 200 of FIG. 2, or any combination thereof, and that also includes additional electronic circuits and components within the SOC.

The GDSII file 626 may be received at a fabrication process 628 to manufacture the sensing circuit 100 of FIG. 1, the sensing circuit 200 of FIG. 2, or any combination thereof according to transformed information in the GDSII file 626. For example, a device manufacture process may include providing the GDSII file 626 to a mask manufacturer 630 to create one or more masks, such as masks to be used for photolithography processing, illustrated as a representative mask 632. The mask 632 may be used during the fabrication process to generate one or more wafers 634. Which may be tested and separated into dies, such as a representative die 636. The die 636 includes a sensing circuit, such as the sensing circuit 100 of FIG. 1, the sensing circuit 200 of FIG. 2, or any combination thereof.

The die 636 may be provided to a packaging process 638 where the die 636 is incorporated, into a representative package 640. For example, the package 640 may include the single die 636 or multiple dies, such as a system-in-package (SiP) arrangement. The package 640 may be configured to conform to one or more standards or specifications, such as Joint Electron Device Engineering Council (JEDEC) standards.

Information regarding the package 640 may be distributed to various product designers, such as via a component library stored at a computer 646. The computer 646 may include a processor 648, such as one or more processing cores, coupled to a memory 610. A printed circuit board (PCB) tool may be stored as processor executable instructions at the memory 650 to process PCB design information 642 received from a user of the computer 646 via a user interface 644. The PCB design information 642 may include physical positioning information of a packaged semiconductor device on a circuit board, the packaged semiconductor device corresponding to the package 640 and includes a sensing circuit, such as the sensing circuit 100 of FIG. 1, the sensing circuit 200 of FIG. 2, or any combination thereof.

The computer 646 may be configured to transform the PCB design information 642 to generate a data file, such as a GERBER file 652 with data that includes physical positioning information of a packaged semiconductor device on a circuit board, as well as layout of electrical connections such as traces and vias, where the packaged semiconductor device corresponds to the package 640 including the sensing circuit. In other embodiments, the data file generated by the transformed PCB design information may have a format other than a GERBER format.

The GERBER file 652 may be received at a board assembly process 651 and used to create PCBs, such as a representative PCB 656, manufactured in accordance with the design information stored within the GERBER file 652. For example, the GERBER file 652 may be uploaded to one or more machines for performing various steps of a PCB production process. The PCB 656 may be populated with electronic components including the package 640 to form a represented printed circuit assembly (PCA) 658.

The PCA 658 may be received at a product manufacture process 660 and integrated into one or more electronic devices, such as a first representative electronic device 662 and a second representative electronic device 664. As an illustrative, non-limiting example, the first representative electronic device 662, the second representative electronic device 664, or both, may be selected from the group of a set top box, a music player, a video player, an entertainment unit, a navigation device, a communications device, a personal digital assistant (PDA), a fixed location data unit, and a computer. As another illustrative, non-limiting example, one or more of the electronic devices 662 and 664 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Embodiments of the disclosure may be suitably employed in any device which includes active integrated circuitry including memory and on-chip circuitry.

Thus, the sensing circuit 100 of FIG. 1, the sensing circuit 200 of FIG. 2, or any combination thereof may be fabricated, processed, and incorporated into an electronic device, as described in the illustrative process 600. One or more aspects of the embodiments disclosed with respect to FIGS. 1-2 may be included at various processing stages, such as within the library file 612, the GDSII file 626, and the GERBER file 652, as well as stored at the memory 610 of the research computer 606, the memory 618 of the design computer 614, the memory 650 of the computer 646, the memory of one or more other computers or processors (not shown) used at the various stages, such as at the board assembly process 654, and also incorporated into one or more other physical embodiments such as the mask 632, the die 636, the package 640, the PCA 658, other products such as prototype circuits or devices (not shown), or any combination thereof. Although various representative stages of production from a physical device design to a final product are depicted, in other embodiments fewer stages may be used or additional stages may be included. Similarly, the process 600 may be performed by a single entity, or by one or more entities performing various stages of the process 600.

Those of skill would further appreciate that the various illustrative logical blocks, configurations, modules, circuits, and algorithm steps described in connection with the embodiments disclosed herein may be implemented as electronic hardware, computer software executed by a processing device such as a hardware processor, or combinations of both. Various illustrative components, blocks, configurations, modules, circuits, and steps have been described above generally in terms of their functionality. Whether such functionality is implemented as hardware or executable software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in a non-transitory storage medium such as random access memory (RAM), magnetoresistive random access memory (MRAM), spin-torque transfer MRAM (STT-MRAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A circuit comprising:
   a degeneration p-channel metal-oxide-semiconductor (PMOS) transistor;
   a load PMOS transistor; and
   a clamp transistor configured to clamp a voltage to a resistance-based memory element during a sensing operation;
   wherein a gate of the load PMOS transistor is controlled by an output of an operational amplifier that has a first input responsive to a control voltage and a second input coupled to a source terminal of the load PMOS transistor and coupled to a drain terminal of the degeneration PMOS transistor.

2. The circuit of claim 1, further comprising a sense amplifier having an input coupled to an output of the load PMOS transistor.

3. The circuit of claim 1, wherein the clamp transistor is coupled to a multiplexor re-channel metal-oxide-semiconductor (NMOS) transistor, and wherein the clamp transistor is coupled to a second operational amplifier.

4. The circuit of claim 1, wherein the resistance-based memory element comprises a magnetic tunnel junction (MTJ) element that is serially coupled to an access transistor within a memory cell.

5. The circuit of claim 1, integrated in at least one semiconductor die.

6. The circuit of claim 1, further comprising a device selected from the group consisting of a set top box, a music player, a video player, an entertainment unit, a navigation device, a communications device, a personal digital assistant (PDA), a fixed location data unit, and a computer, into which the transistors of the circuit are integrated.

7. A method comprising:
controlling a gate voltage applied to a load p-channel metal-oxide semiconductor (PMOS) transistor by an output of an operational amplifier that has a first input responsive to a control voltage and a second input coupled to the load PMOS transistor and to a degeneration PMOS transistor.

8. The method of claim 7, wherein the second input is coupled to a source terminal of the load PMOS transistor and to a drain terminal of the degeneration PMOS transistor.

9. The method of claim 7, wherein controlling the gate voltage is performed at a processor integrated into an electronic device.

10. An apparatus comprising:
means for providing a load in response to a gate voltage, the gate voltage controlled via an output of an operational amplifier that has a first input responsive to a control voltage and a second input coupled to a source terminal of the means for providing the load; and
means for clamping a voltage applied to a resistance-based memory element during a sensing operation, wherein the means for clamping is coupled to a drain terminal of the means for providing the load.

11. The apparatus of claim 10, wherein the second input is coupled to a source terminal of the means for providing the load.

12. The apparatus of claim 10, integrated in at least one semiconductor die.

13. The apparatus of claim 10, further comprising a device selected from the group consisting of a set top box, a music player, a video player, an entertainment unit, a navigation device, a communications device, a personal digital assistant (PDA), a fixed location data unit, and a computer, into which the means for providing and the means for clamping is integrated.

14. A method comprising:
a step for providing a first input to an operational amplifier, wherein the first input is responsive to a control voltage;
a step for providing a second input to the operational amplifier, wherein the second input is coupled to a load p-channel metal-oxide semiconductor (PMOS) transistor and to a degeneration PMOS transistor; and
a step for controlling a gate voltage applied to the load PMOS transistor by an output of the operational amplifier.

15. The method of claim 14, wherein the second input is coupled to a source terminal of the load PMOS transistor and to a drain terminal of the degeneration PMOS transistor.

16. The method of claim 14, wherein the step for providing the first input, the step for providing the second input, and the step for controlling the gate voltage are performed by a processor integrated into an electronic device.

17. A computer readable tangible medium storing instructions executable by a processor to:
control a gate voltage applied to a load p-channel metal-oxide semiconductor (PMOS) transistor by an output of an operational amplifier that has a first input responsive to a control voltage and a second input coupled to the load PMOS transistor and to a degeneration PMOS transistor.

18. The computer readable tangible medium of claim 17, wherein the second input is coupled to a source terminal of the load PMOS transistor and to a drain terminal of the degeneration PMOS transistor.

19. The computer readable tangible medium of claim 17, wherein the processor is integrated in a device selected from the group consisting of a set top box, a music player, a video player, an entertainment unit, a navigation device, a communications device, a personal digital assistant (PDA), a fixed location data unit, and a computer.

20. A method comprising:
receiving design information representing at least one physical property of a semiconductor device, the semiconductor device comprising:
a degeneration p-channel metal-oxide-semiconductor (PMOS) transistor;
a load PMOS transistor; and
a clamp transistor configured to clamp a voltage applied to a resistance based memory element during a sensing operation,
wherein a gate of the load PMOS transistor is controlled by an output of an operational amplifier that has a first input responsive to a control voltage and a second input coupled to a source terminal of the load PMOS transistor and coupled to a drain terminal of the degeneration PMOS transistor;
transforming the design information to comply with a file format; and
generating a data file comprising the transformed design information.

21. The method of claim 20, wherein the data file comprises a GDSII format.

22. The method of claim 20, wherein the data file comprises a GERBER format.

23. A method comprising:
receiving a data file comprising design information corresponding to a semiconductor device; and
fabricating the semiconductor device according to the design information, wherein the semiconductor device comprises:
a degeneration p-channel metal-oxide-semiconductor (PMOS) transistor;
a load PMOS transistor; and
a clamp transistor configured to clamp a voltage applied to a resistance based memory element during a sensing operation,
wherein a gate of the load PMOS transistor is controlled by an output of an operational amplifier that has a first input responsive to a control voltage and a second input coupled to a source terminal of the load PMOS transistor and coupled to a drain terminal of the degeneration PMOS transistor.

24. The method of claim 23, wherein the data file has a GDSII format.

25. The method of claim 23, wherein the data file has a GERBER format.

* * * * *

UNITED STATES PATENT AND TRADEMARK OFFICE
CERTIFICATE OF CORRECTION

PATENT NO.       : 8,693,272 B2  
APPLICATION NO.  : 13/173641  
DATED            : April 8, 2014  
INVENTOR(S)      : Seong-Ook Jung et al.

Page 1 of 1

It is certified that error appears in the above-identified patent and that said Letters Patent is hereby corrected as shown below:

Title Page, Item [73], After the first assignee, add the following:

Industry-Academic Cooperation Foundation, Yonsei University, Seoul, Korea (KR)

To be listed as follows:

[73] Assignees: QUALCOMM Incorporated, San Diego, CA (US)
 Industry-Academic Cooperation Foundation, Yonsei University, Seoul, Korea (KR)

Signed and Sealed this
Nineteenth Day of August, 2014

Michelle K. Lee
*Deputy Director of the United States Patent and Trademark Office*